(12) United States Patent
Chu et al.

(10) Patent No.: US 7,106,590 B2
(45) Date of Patent: *Sep. 12, 2006

(54) COOLING SYSTEM AND METHOD EMPLOYING MULTIPLE DEDICATED COOLANT CONDITIONING UNITS FOR COOLING MULTIPLE ELECTRONICS SUBSYSTEMS

(75) Inventors: Richard C. Chu, Hopewell Junction, NY (US); Michael J. Ellsworth, Jr., Lagrangeville, NY (US); Roger R. Schmidt, Poughkeepsie, NY (US); Robert E. Simons, Poughkeepsie, NY (US); Randy J. Zoodsma, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 314 days.

This patent is subject to a terminal disclaimer.

(21) Appl. No.: 10/726,347

(22) Filed: Dec. 3, 2003

(65) Prior Publication Data
US 2005/0122685 A1   Jun. 9, 2005

(51) Int. Cl.
*H05K 7/20* (2006.01)
*F28D 15/00* (2006.01)
(52) U.S. Cl. .................... 361/701; 62/259.2; 165/80.4; 165/104.33
(58) Field of Classification Search ............... 361/689, 361/699, 701, 702, 703; 62/259.2; 165/80.2, 165/80.4–80.5, 104.33
See application file for complete search history.

(56) References Cited

U.S. PATENT DOCUMENTS 4,729,424 A * 3/1988 Mizuno et al. ............. 165/261

(Continued)

OTHER PUBLICATIONS

Chu et al., pending U.S. Patent Application, "Scalable Coolant Conditioning Unit with Integral Plate Heat Exchanger/Expansion Tank and Method of Use", filed Sep. 13, 2002, U.S. Appl. No. 10/243,708, 29 pages.

(Continued)

*Primary Examiner*—Boris Chervinsky
*Assistant Examiner*—Robert J. Hoffberg
(74) *Attorney, Agent, or Firm*—Lily Neff, Esq.; Kevin P. Radigan, Esq.; Heslin Rothenberg Farley & Mesiti, P.C.

(57) ABSTRACT

A cooling system is provided employing multiple coolant conditioning units (CCUs). Each CCU, which is coupled to a different, associated electronics rack of multiple electronics racks to be cooled, includes a heat exchanger, a first cooling loop with a control valve, and a second cooling loop. The first cooling loop receives chilled facility coolant from a source and passes at least a portion thereof via the control valve through the heat exchanger. The second cooling loop provides cooled system coolant to the associated electronics rack, and expels heat in the heat exchanger from the electronics rack to the chilled facility coolant in the first cooling loop. The control valve allows regulation of the facility coolant flow through the heat exchanger, thereby allowing independent control of temperature of the system coolant in the second cooling loop. Various CCU and associated component redundancies of the cooling system are also provided.

32 Claims, 10 Drawing Sheets

U.S. PATENT DOCUMENTS

| | | | |
|---|---|---|---|
| 4,854,726 A | | 8/1989 | Lesley et al. .................. 374/45 |
| 4,865,123 A | * | 9/1989 | Kawashima et al. ... 165/104.33 |
| 4,873,613 A | | 10/1989 | Iversen ........................ 361/385 |
| 5,144,531 A | | 9/1992 | Go et al. ...................... 361/382 |
| 5,226,471 A | * | 7/1993 | Stefani ........................ 165/200 |
| 5,289,363 A | | 2/1994 | Ferchau et al. ............. 363/141 |
| 5,325,915 A | | 7/1994 | Fouts et al. ................... 165/78 |
| 5,986,882 A | | 11/1999 | Ekrot et al. ................. 361/687 |
| 5,999,404 A | | 12/1999 | Hileman ..................... 361/699 |
| 6,035,655 A | * | 3/2000 | Hare et al. ................. 62/259.2 |
| 6,161,612 A | * | 12/2000 | St.ang.hl et al. ........... 165/80.4 |
| 6,182,742 B1 | * | 2/2001 | Takahashi et al. ..... 165/104.33 |
| 2003/0081380 A1 | * | 5/2003 | Nakagawa et al. ......... 361/687 |

OTHER PUBLICATIONS

Simons, Robert E., "The Evolution of IBM High Performance Cooling Technology", Dec. 1995, 7 pages, IEEE Transactions on Components, Packaging, and Manufacturing Technology—Part A, vol. 18, No. 4.

* cited by examiner fig. 1 fig. 3 fig. 4 fig. 5 fig. 6 fig. 7 fig. 8 fig. 9 fig. 10

COOLING SYSTEM AND METHOD EMPLOYING MULTIPLE DEDICATED COOLANT CONDITIONING UNITS FOR COOLING MULTIPLE ELECTRONICS SUBSYSTEMS

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Cooling System and Method Employing At Least Two Modular Cooling Units For Ensuring Cooling Of Multiple Electronics Subsystems," Chu et al., Ser. No. 10/726,377, filed Dec. 3, 2003; and "Scalable Coolant Conditioning Unit with Integral Plate Heat Exchanger/Expansion Tank and Method of Use," Chu et al., Ser. No. 10/243,708, filed Sep. 13, 2002, which issued on Mar. 30, 2004 as U.S. Pat. No. 6,714,412.

TECHNICAL FIELD

The present invention relates in general to cooling assemblies and other apparatus used for removing heat from electronic devices, modules and systems. More particularly, this invention relates to cooling systems and methods for liquid cooling of electronics subsystems, such as electronics racks, utilizing multiple dedicated coolant conditioning units (CCUs).

BACKGROUND OF THE INVENTION

Heat flux dissipated by electronic equipment, such as microprocessors and power supplies, is again reaching levels that require cooling other than simple air cooling as a means of controlling component temperature. Liquid cooling (e.g., water cooling) is an attractive technology to manage these higher heat fluxes. The liquid absorbs the heat dissipated by the component/modules in an efficient manner, i.e., with minimal temperature rise from the liquid to the component being cooled. Typically, the heat is ultimately transferred from the liquid out into the outside environment. Otherwise, the liquid coolant would continuously rise in temperature.

Figure 1:
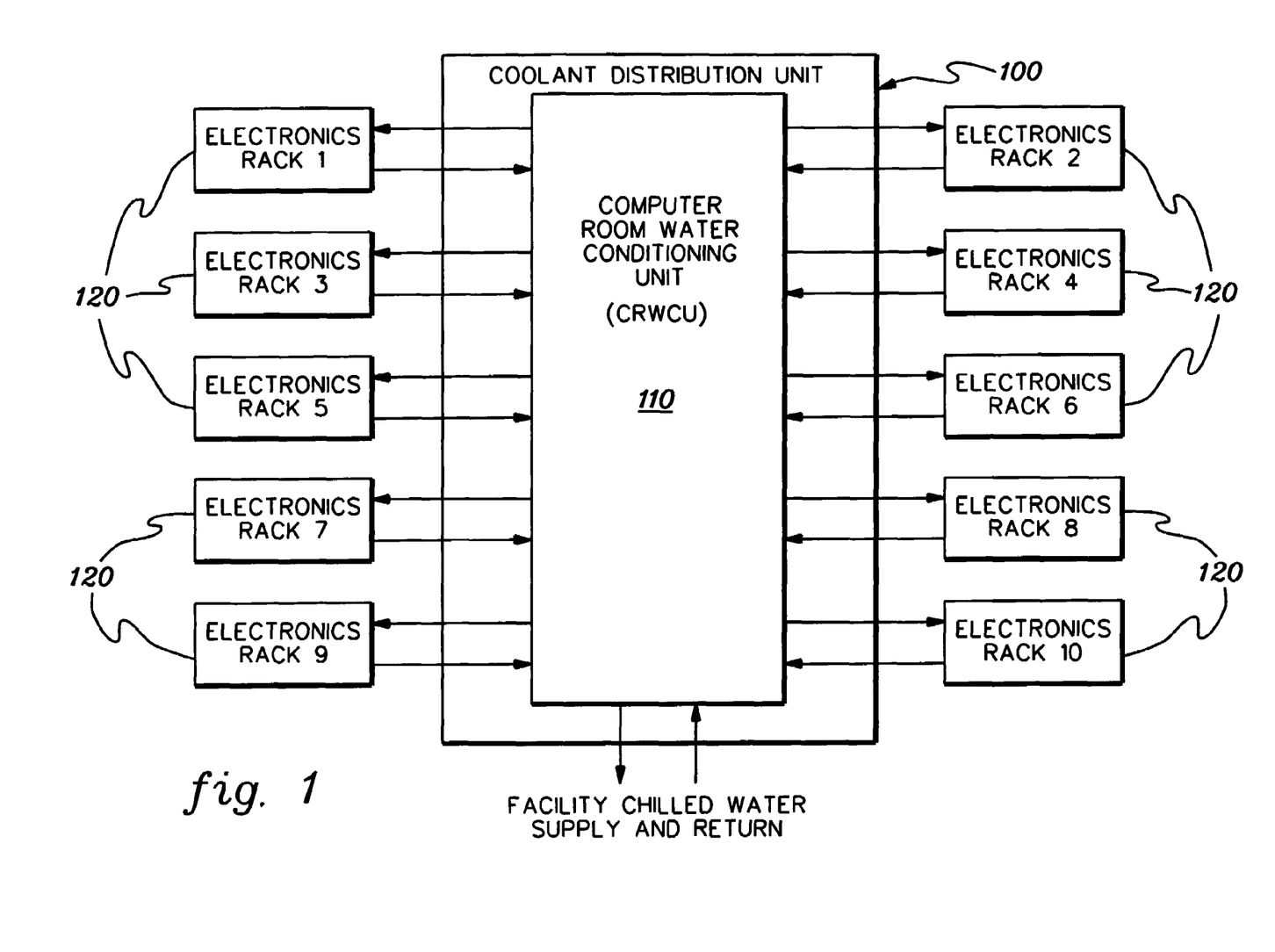
FIG. 1 depicts a conventional coolant distribution unit for a computer room.

From the 1970's through the early 1990's, International Business Machines Corporation accomplished this task by circulating cooling liquid via a coolant distribution unit 100 (FIG. 1). Coolant distribution unit 100 included a single, large computer room water conditioning unit (CRWCU) 110, which distributed conditioned chilled water to the various electronics racks 120 of a mainframe computer system to be cooled. Conventionally, the electronics racks of the mainframe computer included memory frames, processor frames, input/output frames, power frames, etc. Operationally, the CRWCU 110 received customer chilled water which was then used to supply conditioned cooled water to the individual electronics racks of the computer room.

Figure 2:
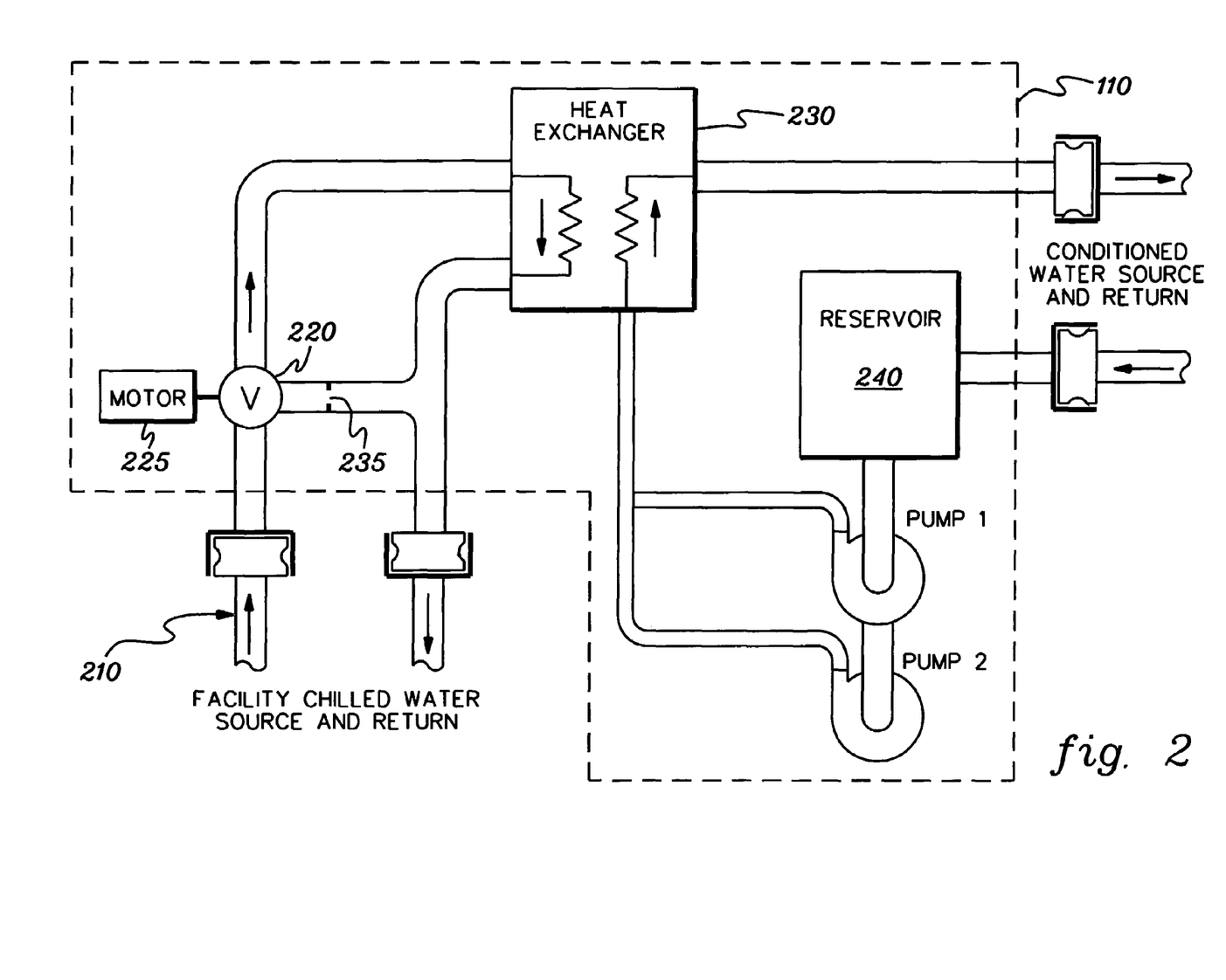
FIG. 2 is a schematic of a conventional computer room water conditioning unit (CRWCU) such as employed by the coolant distribution unit of FIG. 1.

As shown in FIG. 2, the CRWCU 110 included a primary cooling loop wherein building chilled water was supplied 210 and passed through a single control valve 220 driven by a motor 225. Valve 220 determined an amount of building chilled water to be passed through a heat exchanger 230, with a portion of the building chilled water possibly being returned directly to the return via a bypass orifice 235. The CRWCU further included a second cooling loop with a reservoir tank 240 from which water was pumped either by pump 1 or pump 2 into the heat exchanger 230 for conditioning and output therefrom as a conditioned water source to the electronics racks to be cooled within the computer room. The computer room water conditioning unit normally stood separate from the electronics frames, and again, would supply system water (typically maintained at about 22° C.) to all electronics frames of the computer room.

The coolant distribution unit, and more particularly, the computer room water conditioning unit (CRWCU), depicted in FIGS. 1 & 2 contains a single heat exchanger, a single reservoir, a single control valve, and redundant pumps. Thus, in the case of a failed pump, the CRWCU would automatically switch to the redundant pump, but any other malfunction in the coolant distribution unit would have brought down the whole mainframe system. For example, if the heat exchanger, or control valve, or building chilled water source failed, the entire mainframe system in the computer room would also fail. Redundant mainframe computers would have been on the computer room floor to allow continuation of processing (in a degraded mode) until the downed mainframe could be repaired.

SUMMARY OF THE INVENTION

Today, a multi-frame mainframe system such as existed in the 1970's and 1980's has been replaced with single processor frames or racks. Thus, multiple processor frames, from high end, mid-range and low end could now be sourced from a single computer room water conditioning unit such as depicted in FIGS. 1 & 2. Therein lies a problem, however. Any leak in any of the processor frames could cause all of the frames to lose conditioned water. A single leak could bring down the entire computer room floor. Also, a heat exchanger failure or control valve failure or loss of chilled water source could bring down the entire computer room floor.

These shortcomings are overcome and additional advantages are provided through the provision of a cooling system having multiple coolant conditioning units (CCUs). Each CCU of at least some coolant conditioning units of the multiple CCUs provide system coolant to a different, associated electronics subsystem of multiple electronics subsystems to be cooled. Each CCU of the at least some CCUs comprises a heat exchanger, a first cooling loop with a control valve, and a second cooling loop. The first cooling loop receives chilled facility coolant from a source and passes at least a portion thereof via the control valve through the heat exchanger. The second cooling loop provides cooled system coolant to an associated electronics subsystem, and expels heat in the heat exchanger from the associated electronics subsystem to the chilled facility coolant in the first cooling loop. The control valve allows regulation of chilled facility coolant flow through the heat exchanger, thereby allowing independent control of temperature of the system coolant in the second cooling loop.

In another aspect, a cooled electronics system is provided. The cooled electronics system includes multiple electronics subsystems, and multiple coolant conditioning units (CCUs). Each CCU provides system coolant to a different, associated electronics subsystem of the multiple electronics subsystems. Each CCU includes a heat exchanger, a first cooling loop with a control valve, and a second cooling loop. The first cooling loop receives chilled facility coolant from a source and passes at least a portion thereof via the control valve through the heat exchanger. The second cooling loop provides cooled system coolant to the associated electronics subsystem, and expels heat in the heat exchanger from the associated electronics subsystem to the facility coolant in the first cooling loop. The control valve allows regulation of the chilled facility coolant flow through the heat exchanger, and thus, allows independent control of temperature of the system coolant in the second cooling loop for cooling the electronics subsystem associated with the CCU.

In a further aspect, a method for cooling multiple electronics subsystems is provided. The method includes providing multiple coolant conditioning units (CCUs), wherein each CCU of at least some CCUs of the multiple CCUs provides system coolant to a different, associated electronics subsystem of the multiple electronics subsystems to be cooled. Further, each CCU of the at least some CCUs comprises a heat exchanger, a first cooling loop with a control valve, and a second cooling loop with system coolant therein. The method further includes, for each CCU of the at least some CCUs: providing chilled facility coolant to the first cooling loop from a source and passing at least a portion thereof via the control valve through the heat exchanger; providing cooled system coolant within the second cooling loop to the associated electronics subsystem, and expelling heat in the heat exchanger from the associated electronics subsystem to the chilled facility coolant in the first cooling loop, wherein the control valve of the CCU allows regulation of facility coolant flow through the heat exchanger thereby allowing independent control of a temperature of the system coolant in the second cooling loop for cooling the associated electronics subsystem.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics subsystem" comprises any housing, frame, rack, compartment, etc., containing one or more heat generating components of a computer system or other electronics system requiring cooling. The term "electronics rack" includes any frame or rack having a heat generating component of a computer system or electronics system; and may be, for example, a stand alone computer processor having high, mid or low end processing capability. In one embodiment, an electronics rack may comprise multiple electronics drawers, each having one or more heat generating components requiring cooling.

One example of coolant within the coolant distribution unit, or more particularly within the multiple coolant conditioning units (CCUs) described herein, is water. However, the concepts disclosed are readily adapted to use with other types of coolant on both the facility side and the system side. For example, the coolant may comprise a brine, a fluorocarbon liquid, or other similar chemical coolant or a refrigerant, while still maintaining the advantages and unique features of the present invention.

As noted briefly above, power levels in computer equipment (primarily processors) have again risen to a level where they no longer can be simply air cooled. These components will likely be water cooled. Heat dissipated by the processor can be transferred to the water via a water cooled cold plate. Water typically available at customer locations (i.e., data centers) is not suitable for use in these cold plates. First, condensation formation is a concern as the temperature of the data center water, ranging from 7° C. to 15° C., is far below the room's dew point (typically 18–23° C.). Second, the relatively poor quality of the water (its chemistry, cleanliness, etc.) impacts system reliability. It is therefore desirable to utilize a water cooling/conditioning unit that circulates high quality water to/from the electronics to be cooled and rejects the heat from the data center water. As used herein, "facility water" or "facility coolant" refers to this data center water or coolant, while "system water" or "system coolant" refers to the cooled/conditioned water or coolant, respectively, circulating between the coolant distribution unit and the electronics subsystem being cooled.

Generally stated, provided herein is a scalable coolant distribution unit which sources cooled system coolant to a plurality of electronics racks from a bank of dedicated coolant conditioning units (CCUs). Each electronics rack is connected to an associated CCU, wherein the CCU is dedicated to that particular electronics rack. Thus, a leak in any processor frame only causes that particular frame to go down. This significantly reduces the leak susceptibility in a cooled multi-rack computer environment. As explained further below, further improvement and reliability is obtained by providing redundant CCUs. This provides added protection against, for example, a heat exchanger failure, a control valve failure, or loss of chilled facility coolant.

Figure 3:
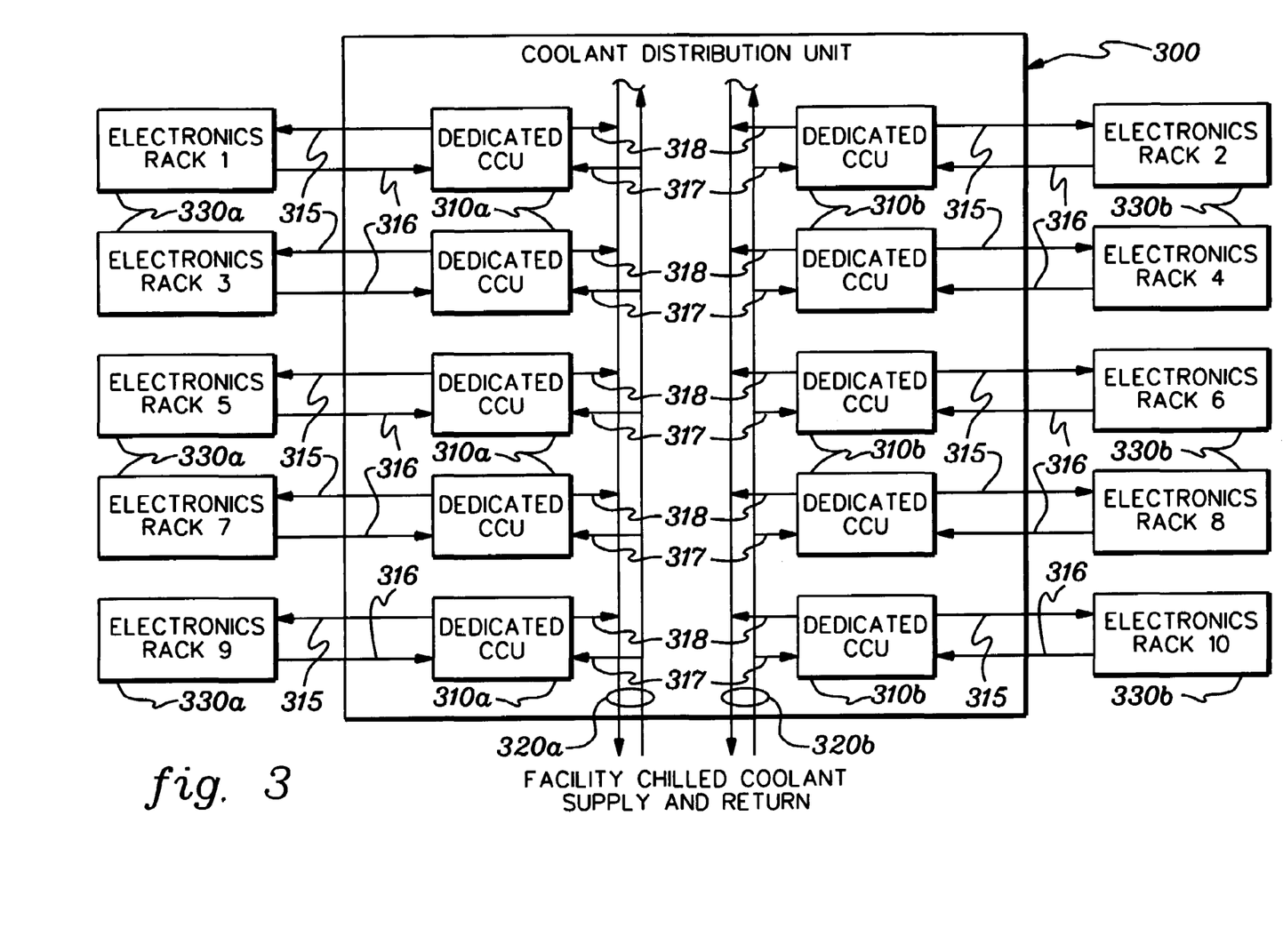
FIG. 3 depicts one embodiment of a coolant distribution unit employing multiple dedicated coolant conditioning units, in accordance with an aspect of the present invention.

FIG. 3 depicts one embodiment of a coolant distribution unit 300 in accordance with an aspect of the present invention. Unit 300 includes two banks of dedicated coolant conditioning units (CCUs) 310a, 310b. Each bank of dedicated CCUs is serviced by separate supply and return lines 320a, 320b for the chilled facility coolant. As shown, each dedicated CCU is connected to an associated electronics rack via a system coolant supply line 315 and a system coolant return line 316. In addition, each dedicated CCU 310a, 310b is coupled to the respective chilled facility coolant supply and return lines 320a, 320b via coolant inlet lines 317 and coolant outlet lines 318. Note that the ten electronics rack example of FIG. 3 is shown by way of example only.

Advantageously, a coolant leak in any one of the electronics racks, or a failure in any one dedicated CCU will result in only the associated electronics rack being shut down. Further, because the volume of coolant in the dedicated CCUs is significantly less than in the CRWCU embodiment such as depicted in FIG. 1, the amount of water available to damage the electronics within the rack(s) and the computer room floor, in general, is significantly reduced. This significantly reduces the leak susceptibility in the cooled multi-rack computer environment.

Figure 4:
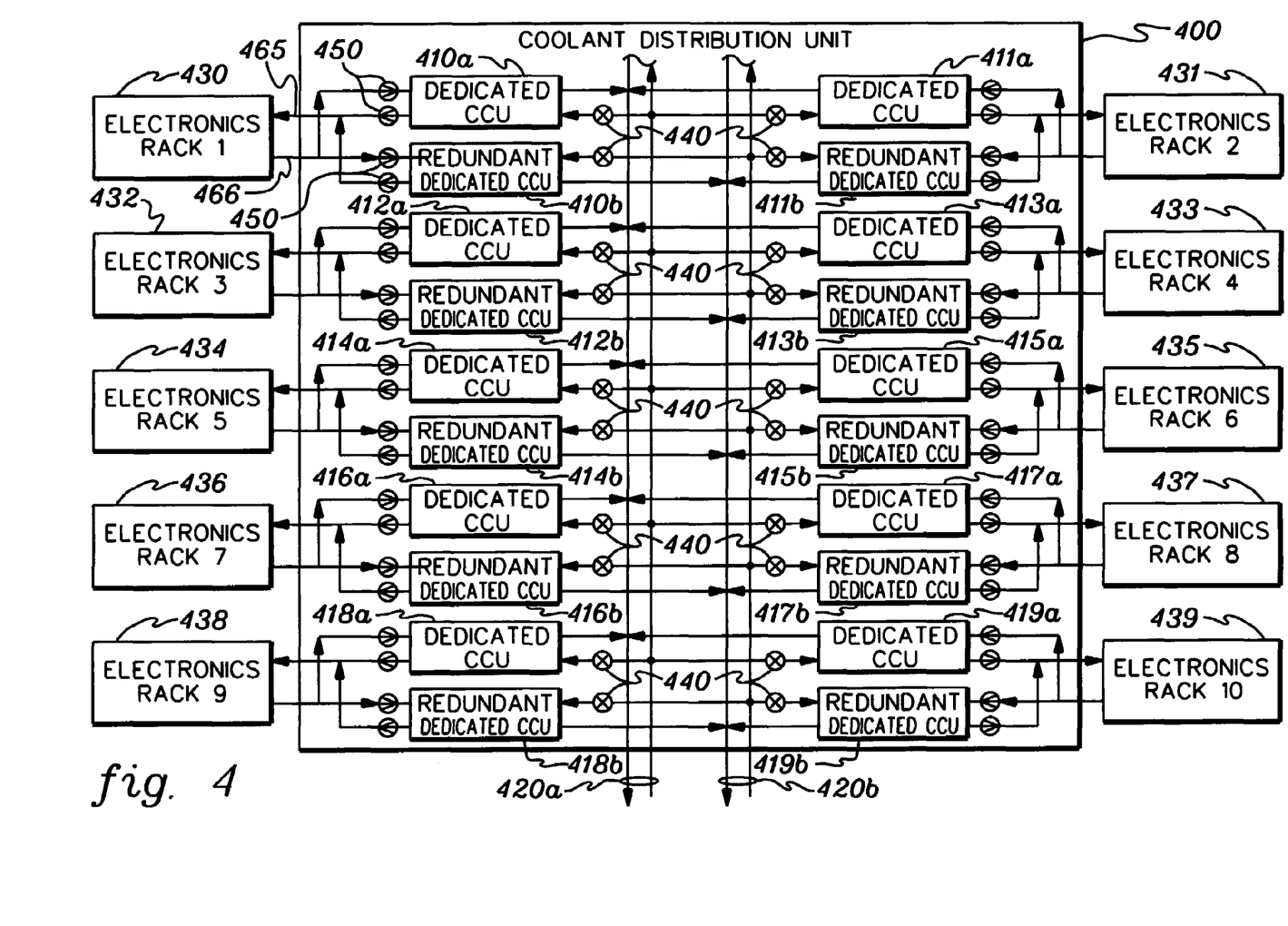
FIG. 4 depicts an alternate embodiment of a coolant distribution unit employing multiple dedicated coolant conditioning units, in accordance with an aspect of the present invention.

FIG. 4 depicts an alternate embodiment of a cooling system in accordance with an aspect of the present invention wherein a coolant distribution unit 400 includes pairs of dedicated CCUs. Each CCU pair includes a primary dedicated CCU 410a, 411a, 412a, 413a, 414a, 415a, 416a, 417a, 418a & 419a and a redundant dedicated CCU 410b, 411b, 412b, 413b, 414b, 415b, 416b, 417b, 418b & 419b. Controllable valves 440 are provided in series with the facility coolant inlets between the primary dedicated CCUs 410a–419a and a primary chilled facility coolant supply and return 420a, as well as between the inlet lines for the redundant dedicated CCUs 410b–419b and a redundant chilled facility coolant supply and return 420b. Valves 440, which in one example might comprise solenoid shutoff valves, are controllable by a controller (see FIG. 10) within or external to the coolant distribution unit. Upon failure of a primary dedicated CCU, the redundant dedicated CCU can be switched into service. Appropriately oriented check valves 450 are also provided in series with the system coolant supply line 465 and the system coolant return line 466 providing fluid communication with the dedicated CCU and the redundant dedicated CCU of a CCU pair. Values 450 also prevent recirculation through the idle CCU.

Figure 5:
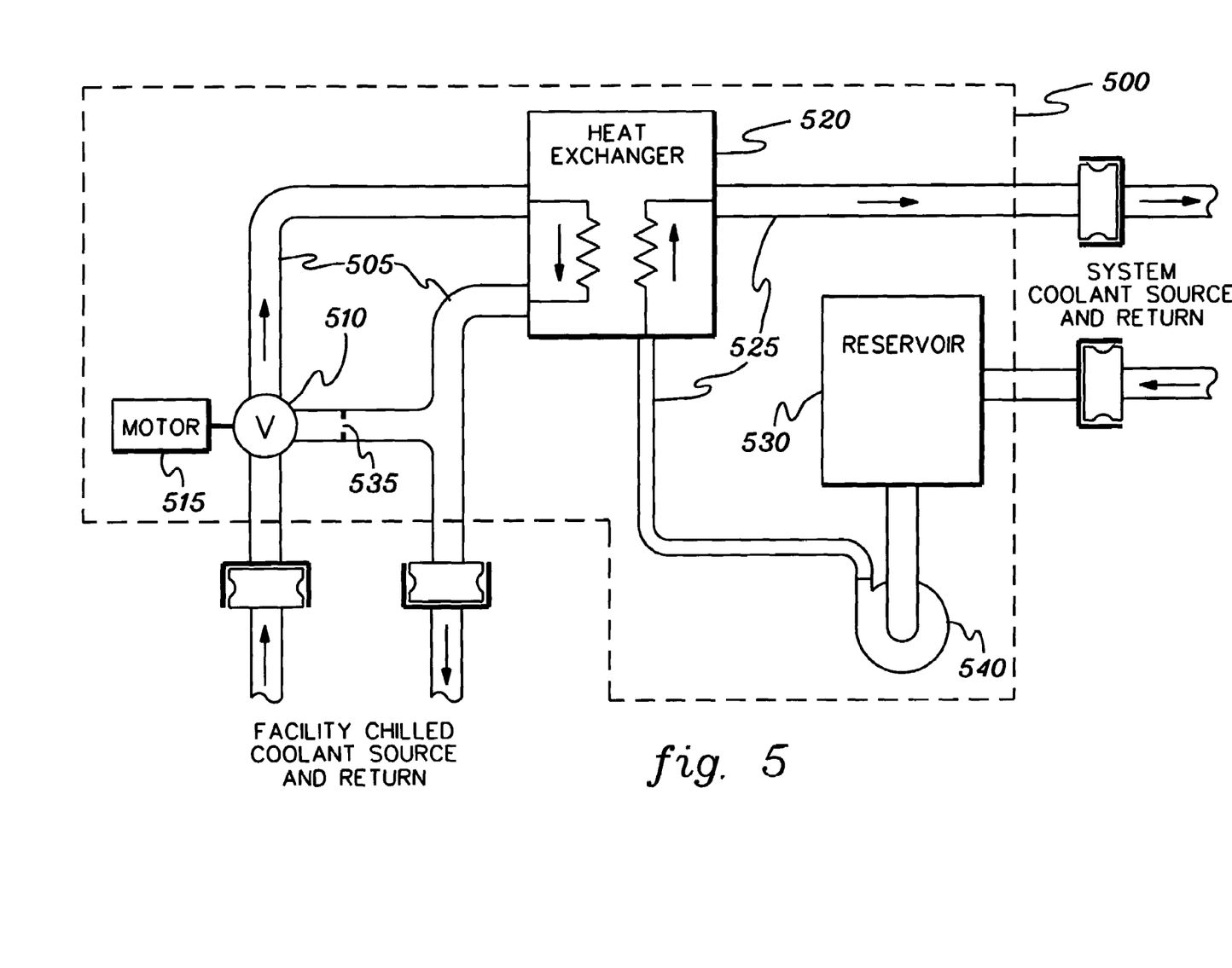
FIG. 5 depicts one embodiment of a dedicated coolant conditioning unit, in accordance with an aspect of the present invention.

Each CCU, in either FIG. 3 or FIG. 4, may have a structure similar to the CRWCU depicted in FIG. 2, but be sized with much smaller components. FIG. 5 depicts another embodiment of a coolant conditioning unit, which is particularly applicable to the coolant distribution unit embodiment of FIG. 4 having CCU pairs. In FIG. 5, the water conditioning unit, generally denoted 500, includes a first cooling loop 505, a heat exchanger 520 and a second cooling loop 525. Facility chilled coolant (e.g., water) is sourced and returned through the first cooling loop 505, which includes a temperature control valve 510, driven by a motor 515. Valve 510 determines the amount of facility chilled coolant to be passed through heat exchanger 520, with a portion of the chilled coolant potentially being returned directly to the return via a bypass orifice 535.

The second cooling loop 525 has in series therewith a reservoir 530 and a pump 540 for circulating system coolant (e.g., water) between the heat exchanger 520 and the associated electronics rack to be cooled. Note that because of the redundant dedicated CCU in a CCU pair, only a single pump 540 is employed within the CCU of FIG. 5. As noted above, a failure in any pump, heat exchanger or control valve within a particular dedicated CCU would cause the controller to switch over to the redundant CCU of the CCU pair servicing a particular electronics rack. In the embodiment of FIG. 4, each CCU of a CCU pair is connected to a different facility chilled coolant source so that loss of one chilled coolant source causes the controller to switch over to the redundant facility chilled coolant source (e.g., employing the redundant CCUs). This configuration provides enhanced availability of cooling to all electronics subsystems being cooled by the coolant distribution unit.

Also shown in FIG. 5 are couplings at the facility chilled coolant source and return lines, as well as at the system coolant source and return lines. These couplings allow a particular dedicated CCU to be removable and/or insertable into the coolant distribution unit, for example, for servicing, repair, or addition of CCUs to the coolant distribution unit. In one embodiment, these couplings could comprise quick connects/disconnects, and appropriate isolation valves could be provided on either side of the connects/disconnects to facilitate insertion and removal of a CCU. Note that expansion of the coolant distribution unit by the addition of dedicated CCUs or CCU pairs might be desirable where the number of electronics racks to be cooled is to be increased, for example, as a business expands. Thus, the concepts discussed herein disclose scalability of the coolant distribution unit.

Figure 6:
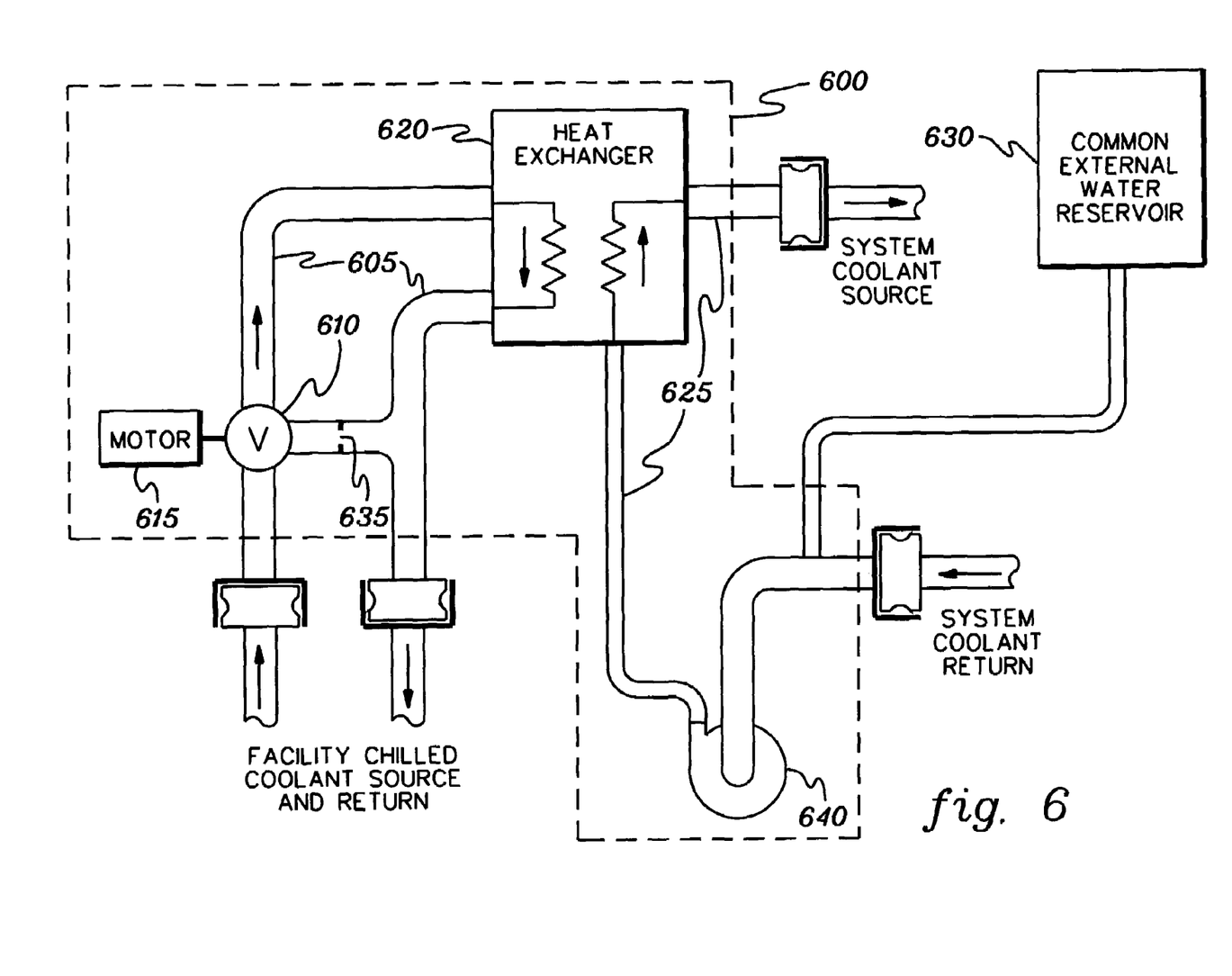
FIG. 6 depicts an alternate embodiment of a coolant conditioning unit, in accordance with an aspect of the present invention.

FIG. 6 depicts another embodiment of a coolant conditioning unit 600, which could be employed with a coolant distribution unit such as depicted in FIG. 3 or FIG. 4. In the coolant conditioning unit of FIG. 5, reservoir 530 is included internal to each dedicated unit, which depending upon the implementation, may require an excessive amount of space. In FIG. 6, the internal reservoir is removed from the CCU and a common external system coolant reservoir 630 is provided. The reservoir 630 could supply additional system coolant (e.g., water) to some or all of the dedicated CCUs in the coolant distribution unit. As shown in FIG. 6, CCU 600 includes a primary cooling loop 605 where facility chilled coolant (e.g., water) is supplied and passed through a single control valve 610 driven by a motor 625. Valve 610 determines an amount of facility coolant to be passed through a heat exchanger 620, with a portion of the chilled coolant possibly being returned directly to the return via a bypass orifice 635. A second cooling loop 625 includes a pump 640, which circulates cooled system coolant (e.g., water) between heat exchanger 620 and an associated electronics rack (not shown). Advantageously, the common external system coolant reservoir can operate both as a fill reservoir and as a coolant makeup reservoir for a coolant distribution unit having multiple dedicated CCUs. Reservoir 630 can also accommodate any expansion of the system coolant in the second cooling loops of the dedicated CCUs. Using the CCU embodiment of FIG. 6, consideration should be given as to how the external system coolant reservoir is connected to the various secondary cooling loops of the dedicated CCUs to ensure that a leak in one CCU will not drain all the CCUs connected to the reservoir.

Figure 7:
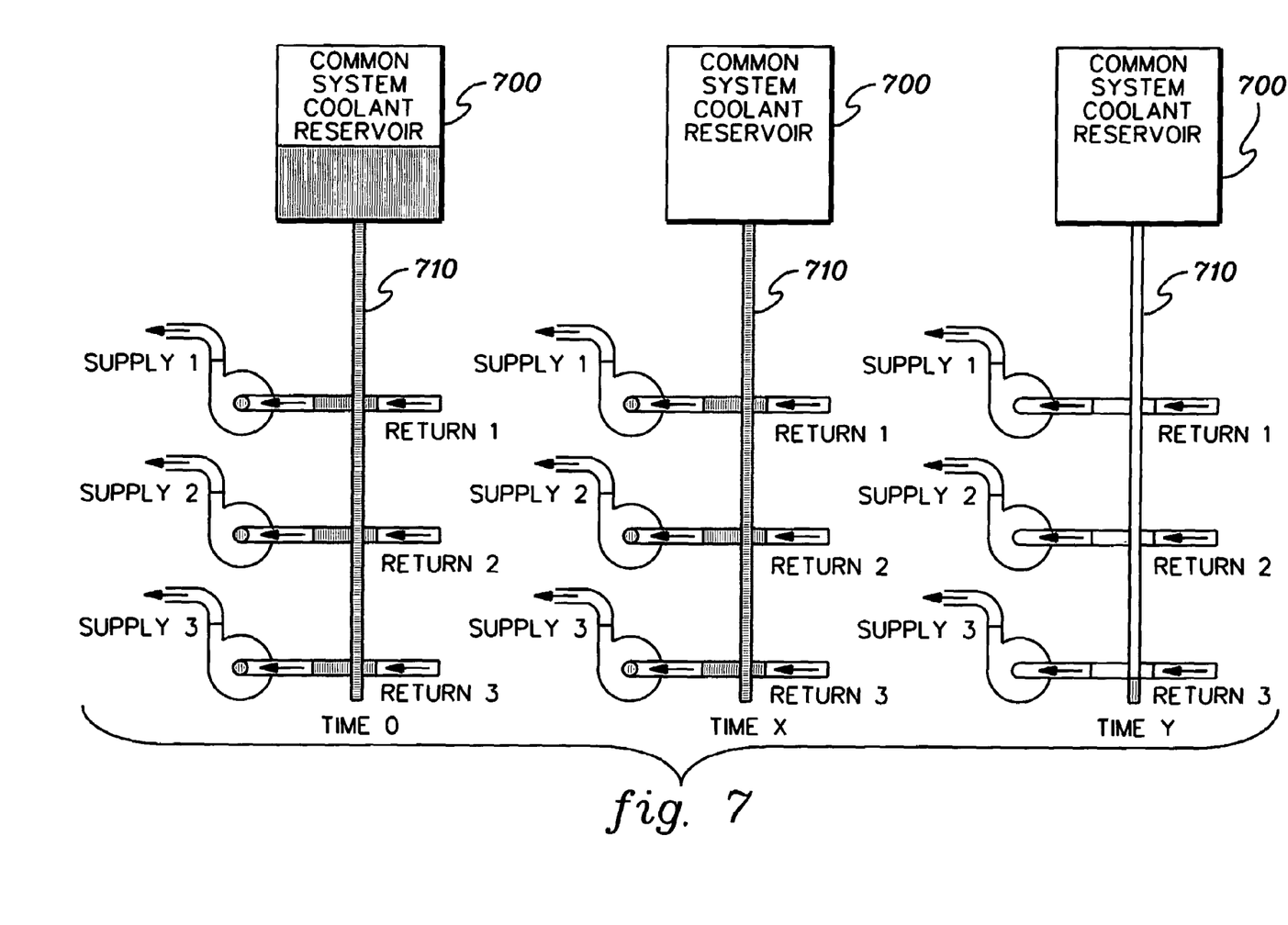
FIG. 7 depicts a partial coolant conditioning unit (CCU) showing a problem example employing a common external system coolant reservoir with a common feed line.

For example, FIG. 7 depicts an embodiment wherein a system coolant reservoir 700 provides coolant to multiple secondary cooling loops using a common supply line 710. At time 0, the secondary cooling loop for the third, partially depicted CCU is assumed to begin leaking. At later time X, the extra system coolant has drained from the reservoir 700, but still remains within the common supply line 710. However, at subsequent time Y, the system coolant is shown drained from the common supply line 710, as well as from the secondary cooling loops of the three partially shown CCUs, thus causing shutdown of the associated electronics racks due to a lack of cooling.

Figure 8:
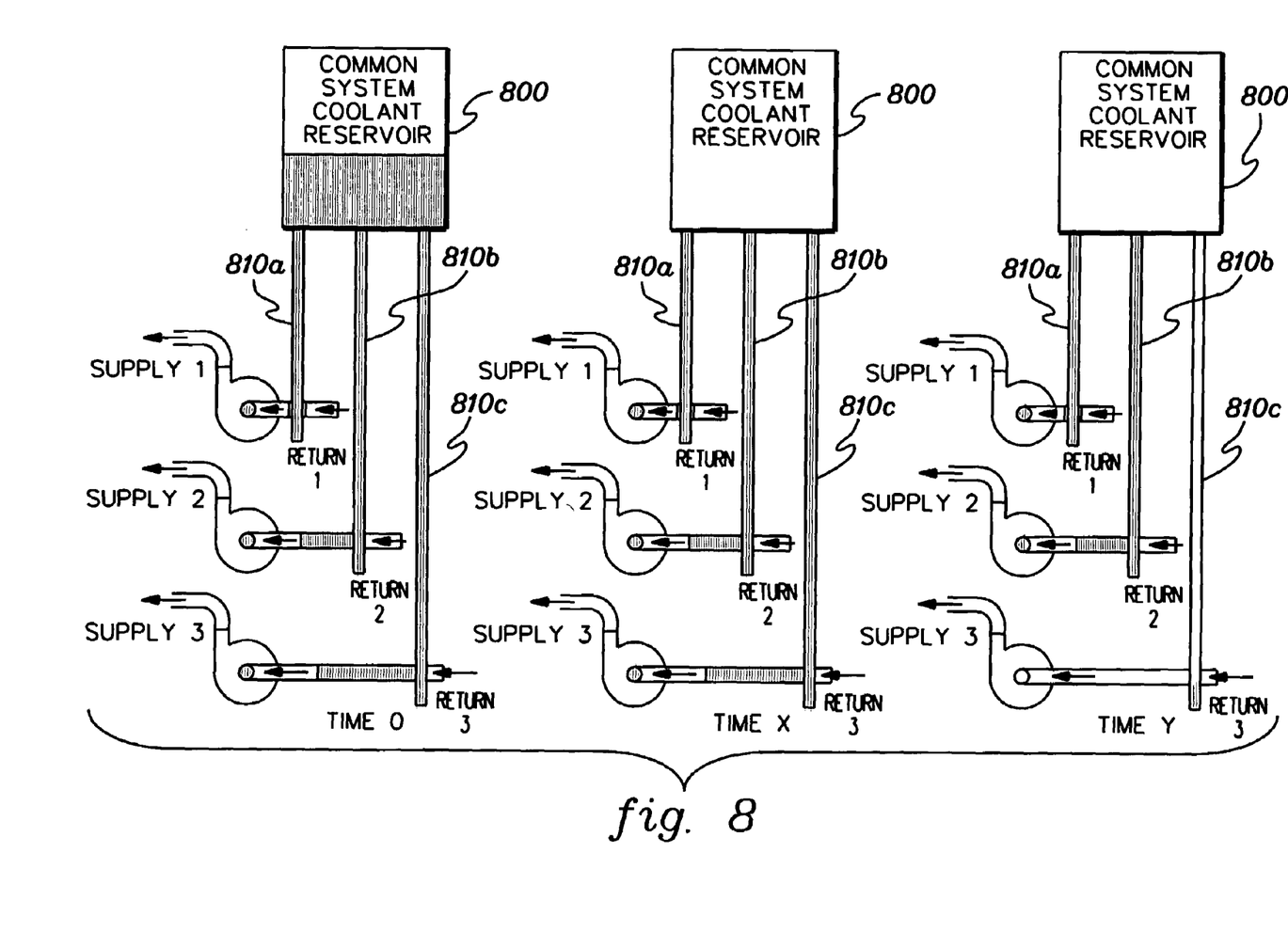
FIG. 8 depicts an alternate, partial CCU embodiment employing a common external system coolant reservoir and multiple feed lines to the multiple dedicated coolant conditioning units, in accordance with an aspect of the present invention.

An alternate arrangement for connecting the external system coolant reservoir to the individual CCUs is depicted in FIG. 8. In this embodiment, multiple supply lines 810*a*, 810*b*, 810*c* connect the system coolant reservoir 800 to the respective dedicated CCUs. Essentially, there is a coolant supply line between the external reservoir and each CCU. Again, a leak is assumed to occur at time 0 in the third partially depicted CCU, which at time X results in draining of the external system coolant reservoir 800. At a later time Y, coolant has also drained from the coolant supply line 810*c* providing fluid to the third CCU, as well as from the secondary cooling loop within the third CCU. However, coolant remains within the supply lines 810*a* and 810*b*, thus allowing the first CCU and second CCU to continue operation while the failure is being addressed.

Figure 9:
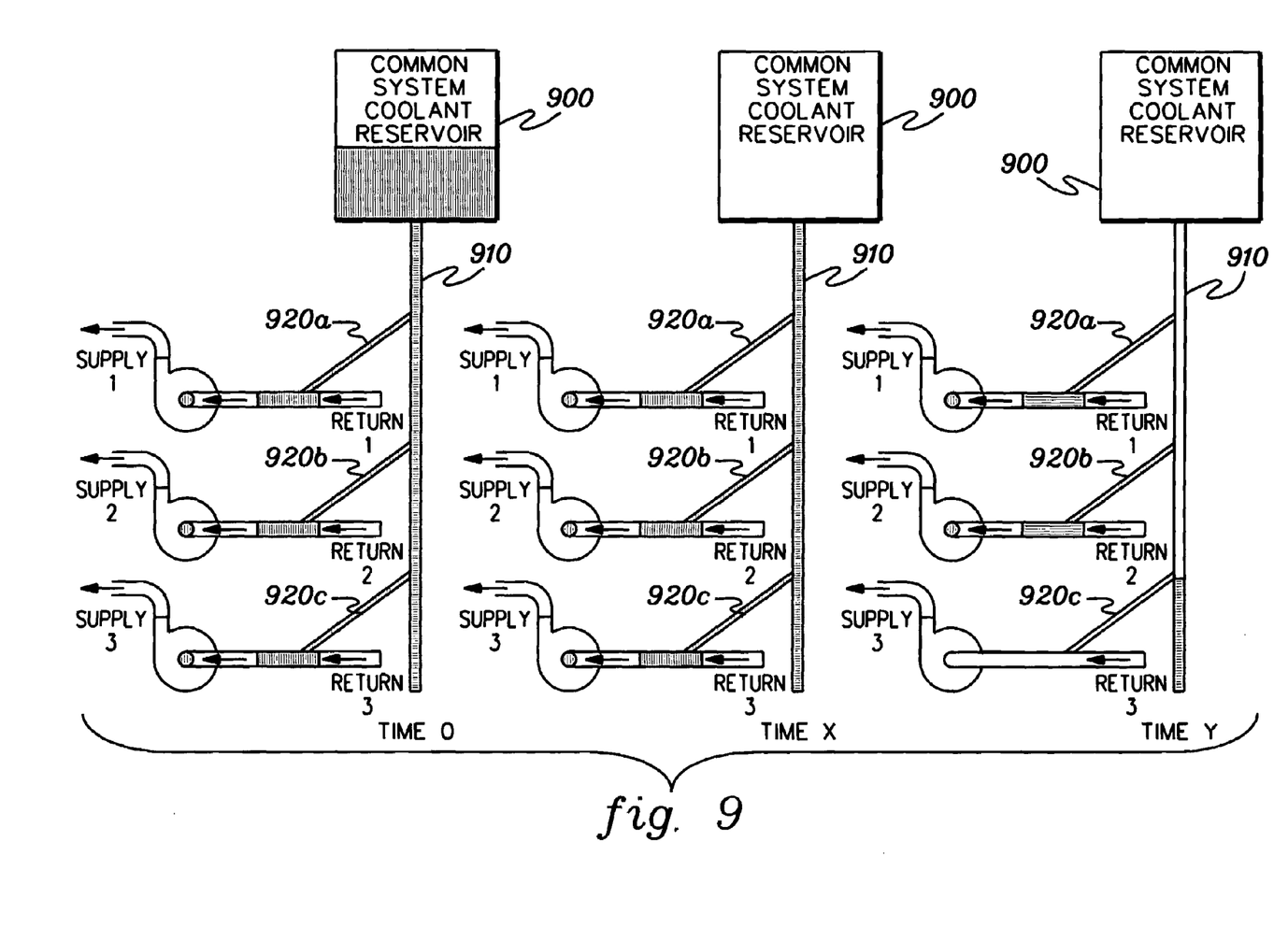
FIG. 9 depicts another alternate, partial CCU embodiment employing a common external system coolant reservoir and a common feed line to the multiple dedicated coolant conditioning units, in accordance with an aspect of the present invention.

FIG. 9 depicts still another embodiment for connecting an external system coolant reservoir to multiple CCUs such as depicted in FIG. 6. In this embodiment, the reservoir 900 provides coolant via a common supply line 910 to multiple CCUs. Common supply line 910, however, is individually connected via tap or branch supply lines 920*a*, 920*b*, 920*c* to the individual CCUs. As shown, these branch supply lines are at an upward angle from the secondary cooling loop of the respective CCU to where connection is made to the common supply line 910. This will prevent draining of the branch supply lines should a failure occur in the common supply line. Again, failure is assumed to occur at time 0 in the secondary cooling loop of the third depicted CCU. At subsequent time X, coolant has drained from the reservoir, but remains within the common supply line 910. At later time Y, coolant has drained from the common supply line 910 to a level below the branch supply line 920*c* coupling common supply line 910 and the secondary cooling loop having the leak within the third CCU. As shown, water remains in the branch supply lines 920*a* and 920*b*, which is sufficient to allow continued operation of the respective first and second coolant conditioning units, and thus allow continued operation of the associated electronics racks (not shown).

Figure 10:
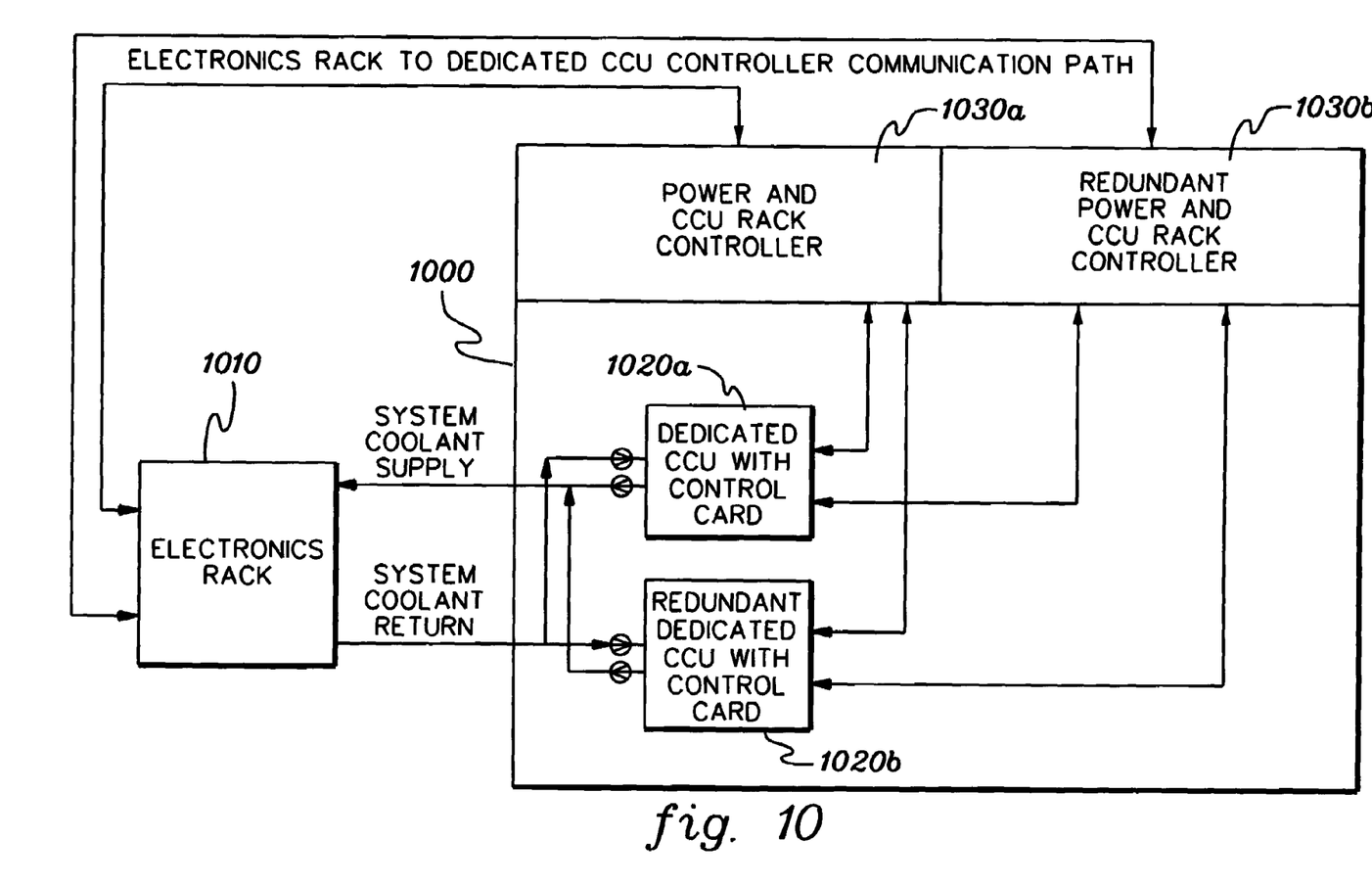
FIG. 10 is a schematic of one embodiment of a power and frame controller showing communication and control paths between a CCU pair, an electronics rack, and the power and frame controller, in accordance with an aspect of the present invention.

As noted above, a controller preferably provides power and control to the various CCUs within a coolant distribution unit such as depicted in FIGS. 3 & 4. The controller comprises an upper level of intelligence, and is preferably also implemented in a redundant fashion as depicted in FIG. 10. In this figure, a coolant distribution unit 1000 is shown to include multiple dedicated CCUs 1020*a*, 1020*b*, each of which has a control card controllable by a controller 1030*a*. A redundant power and frame controller 1030*b* is also provided. The controllers 1030*a*, 1030*b* are in communication with each electronics rack 1010, for example, for sensing one or more operational parameters of various electronic components within the rack or coolant passing through the rack. As in the example depicted in FIG. 4, there is a system coolant supply line connecting the pair of dedicated CCUs 1020*a*, 1020*b* with the associated electronics rack 1010, as well as a system coolant return path for returning coolant from the rack to the operational dedicated CCU. Which dedicated CCU is operational in a given CCU pair is under the control of the currently functioning controller 1030*a*, 1030*b*.

Note that in the example of FIG. 10, power to the individual dedicated CCUs in a coolant distribution unit can be sourced from either controller 1030*a*, 1030*b*. A loss of one power source/controller thus does not cause the respective CCU pair to lose power. Further, note that the control cards within the dedicated CCUs 1020*a*, 1020*b* can be used to both sense operation of the CCU, as well as regulate the CCU. For example, the card can be used to control the temperature control valve and the speed of the pumps within the CCU. The card can also sense and regulate system coolant to a given temperature, as well as report any problems to the frame controller 1030*a* and redundant frame controller 1030*b*. The controllers 1030*a*, 1030*b* control which CCU is on for a given CCU pair, and what temperature to regulate the system coolant to. The controllers know when a fault occurs, and can take action based upon detection of the fault to switch over, for example, to a redundant CCU of a CCU pair. Thus, no single loss of power connection or communication path within the coolant distribution unit should bring down the overall cooling system.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling system comprising:
    multiple coolant conditioning units (CCUs), each CCU of at least some coolant conditioning units of the multiple CCUs providing system coolant to a different, associated electronics subsystem of multiple electronics subsystems to be cooled; and
    wherein each CCU of the at least some CCUs comprises a heat exchanger, a first cooling loop with a control valve, and a second cooling loop, the first cooling loop receiving chilled facility coolant from a source and passing at least a portion thereof via the control valve through the heat exchanger, the second cooling loop providing cooled system coolant to the associated electronics subsystem, and expelling heat in the heat exchanger from the associated electronics subsystem to the chilled facility coolant in the first cooling loop, wherein the control valve allows regulation of facility coolant flow through the heat exchanger, thereby allowing independent control of a desired temperature of the system coolant in the second cooling loop for cooling the associated electronics subsystem.

2. The cooling system of claim 1, wherein the source of chilled facility coolant comprises a common source of chilled facility coolant supplied to the at least some CCUs.

3. The cooling system of claim 2, wherein the common source of chilled facility coolant comprises at least two source input lines and at least two source return lines, each input line and each return line servicing at least two CCUs of the multiple CCUs.

4. The cooling system of claim 1, wherein the multiple CCUs comprise multiple dedicated CCUs, wherein each dedicated CCUs is associated with a different electronics subsystem to be cooled.

5. The cooling system of claim 4, wherein the multiple electronics subsystems comprise multiple electronics racks, each electronics rack being cooled by an associated, dedicated CCU of the multiple CCUs.

6. The cooling system of claim 1, wherein the multiple CCUs comprise multiple CCU pairs, each CCU pair comprising a dedicated CCU and a redundant dedicated CCU for cooling a different, associated electronics subsystem of the multiple electronics subsystems.

7. The cooling system of claim 6, further comprising a controller for monitoring operation of the CCU pairs and upon detection of a failure in a dedicated CCU for automatically switching to the redundant dedicated CCU of the CCU pair having the failure to ensure continued cooling of the associated electronics subsystem.

8. The cooling system of claim 7, further comprising shutoff valves coupled to the dedicated CCU and the redundant dedicated CCU of each CCU pair of the multiple CCU pairs for selectively directing chilled facility coolant flow through one of the CCUs of the CCU pair.

9. The cooling system of claim 7, further comprising redundant facility coolant supply lines and redundant facility coolant return lines, wherein chilled facility coolant can be automatically switched from one supply line to another supply line or from one return line to another return line upon detection of a failure in any one of the lines.

10. The cooling system of claim 6, further comprising a controller and a redundant controller for monitoring operation of the CCU pairs, the redundant controller functioning in place of the controller upon detection of a failure in the controller.

11. The cooling system of claim 1, wherein each CCU of the at least some CCUs further includes a reservoir in series with the second cooling loop for ensuring an adequate supply of system coolant flow through the second cooling loop.

12. The cooling system of claim 1, further comprising an external system coolant reservoir shared by at least two CCUs of the at least some CCUs for ensuring sufficient system coolant flow through the second cooling loop of each CCU of the at least two CCUs.

13. The cooling system of claim 12, wherein the external system coolant reservoir provides system coolant to the second cooling loop of each CCU of the at least some CCUs as needed.

14. The cooling system of claim 13, wherein a different supply line connects the external system coolant reservoir to the second cooling loop of each CCU of the at least some CCUs, and wherein a fluid communication path failure in one supply line or one second cooling loop only affects the CCU having the failing supply line or failing second cooling loop.

15. The cooling system of claim 13, wherein a common supply line from the external system coolant reservoir supplies the at least two CCUs with additional system coolant to the second cooling loop thereof, and wherein each second cooling loop of the at least two CCUs is coupled to the common supply line via an upwardly extending branch line which continues to hold system coolant notwithstanding removal of system coolant from the common supply line.

16. A cooled electronics system comprising:
multiple electronics subsystems;
multiple coolant conditioning units (CCUs), each CCU of the multiple CCUs providing system coolant to a different, associated electronics subsystem of the multiple electronics subsystems; and
wherein each CCU of the multiple CCUs comprises a heat exchanger, a first cooling loop with a control valve, and a second cooling loop, the first cooling loop receiving chilled facility coolant from a source and passing at least a portion thereof via the control valve through the heat exchanger, the second cooling loop providing cooled system coolant to the associated electronics subsystem, and expelling heat in the heat exchanger from the associated electronics subsystem to the chilled facility coolant in the first cooling loop, wherein the control valve allows regulation of facility coolant flow through the heat exchanger, thereby allowing independent control of temperature of the system coolant in the second cooling loop for cooling the associated electronics subsystem.

17. The cooled electronics system of claim 16, wherein the multiple electronics subsystems comprise multiple electronics racks.

18. The cooled electronics system of claim 16, wherein the source of chilled facility coolant comprises a common source of chilled facility service coolant, and wherein at least two source input lines and at least two source return lines are provided coupled between the source and the multiple CCUs, each source input line and each source return line servicing at least two CCUs of the multiple CCU's.

19. The cooled electronics system of claim 16, wherein the multiple CCUs comprise multiple CCU pairs, each CCU pair comprising a dedicated CCU and a redundant dedicated CCU for cooling a different, associated electronics subsystem of the multiple electronics subsystems.

20. The cooled electronics system of claim 19, further comprising a controller for monitoring operation of the CCU pairs and upon detection of a failure in a dedicated CCU for automatically switching to the redundant dedicated CCU for the CCU pair having the failure to ensure continued cooling of the associated electronics subsystem.

21. The cooled electronics system of claim 20, further comprising shutoff valves coupled to the dedicated CCU and the redundant CCU of each CCU pair of the multiple CCU pairs for selectively directing chilled facility coolant through one of the CCUs of the CCU pair.

22. The cooled electronics system of claim 20, further comprising redundant facility coolant supply lines and redundant facility coolant return lines, wherein chilled facility coolant can be switched from one supply line to another supply line or from one return line to another return line upon detection of a failure in one of the lines.

23. The cooled electronics system of claim 19, further comprising a redundant controller for monitoring operation of the CCU pairs, the redundant controller functioning in place of the controller upon detection of a failure in the controller.

24. The cooled electronics system of claim 16, wherein each CCU of at least some CCUs of the multiple CCUs further includes a reservoir in series with the second cooling loop for ensuring adequate system coolant flow through the second cooling loop.

25. The cooled electronics system of claim 16, further comprising an external system coolant reservoir shared by at least two CCUs of the multiple CCUs for ensuring sufficient system coolant flow through the second cooling loop of each CCU of the at least two CCUs.

26. The cooled electronics system of claim 25, wherein a different supply line connects the external system coolant reservoir to the second cooling loop of each CCU of the at least two CCUs, and wherein a fluid communication path failure in one supply line or one second cooling loop only affects the CCU having the failing supply line or failing second cooling loop.

27. The cooled electronics system of claim 25, wherein a common supply line from the external system coolant reservoir supplies system coolant to the second cooling loop of each of the at least two CCUs, and wherein each second cooling loop of the at least two CCUs is coupled to the common supply line via an upwardly extending branch line which continues to hold system coolant notwithstanding removal of system coolant from the common supply line.

28. A method for cooling multiple electronics subsystems, the method comprising:

provided multiple coolant conditioning units (CCUs), each CCU of at least some CCUs of the multiple CCUs providing system coolant to a different, associated electronics subsystem of the multiple electronics subsystems to be cooled, wherein each CCU of the at least some CCUs comprises a heat exchanger, a first cooling loop with a control valve, and a second cooling loop with system coolant;

providing, for each CCU of the at least some CCUs, chilled facility coolant to the first cooling loop from a source and passing at least a portion thereof via the control valve through the heat exchanger;

providing, for each CCU of the at least some CCUs, cooled system coolant within the second cooling loop to the associated electronics subsystem, and expelling heat in the heat exchanger from the associated electronics subsystem to the chilled facility coolant in the first cooling loop; and wherein the control valve of the CCU allows regulation of facility coolant flow through the heat exchanger, thereby allowing independent control of a desired temperature of the system coolant in the second cooling loop for cooling the associated electronics subsystem.

29. The method of claim 28, wherein the providing of multiple CCUs comprises providing multiple CCU pairs, each CCU pair comprising a dedicated CCU and a redundant dedicated CCU for cooling a different, associated electronics subsystem of the multiple electronics subsystems.

30. The method of claim 29, further comprising monitoring operation of the CCU pairs and upon detection of a failure at a dedicated CCU, automatically switching to the redundant dedicated CCU of the CCU pair having the failure to ensure continued cooling of the associated electronics subsystem.

31. The method of claim 30, further comprising providing redundant facility supply lines and redundant facility coolant return lines, and automatically switching from one supply line to another supply line or from one return line to another return line upon detection of a failure in any one of the lines.

32. The method of claim 29, further comprising providing redundant controllers for monitoring operation of the CCU pairs, and automatically switching control to a redundant controller upon detection of a failure in one controller.

* * * * *